United States Patent [19]
Heavlin et al.

[11] Patent Number: 5,946,214
[45] Date of Patent: Aug. 31, 1999

[54] COMPUTER IMPLEMENTED METHOD FOR ESTIMATING FABRICATION YIELD FOR SEMICONDUCTOR INTEGRATED CIRCUIT INCLUDING MEMORY BLOCKS WITH REDUNDANT ROWS AND/OR COLUMNS

[75] Inventors: William D. Heavlin, San Francisco; Richard C. Kittler, Sunnyaale; Ping Wen, Sunnyvale, all of Calif.

[73] Assignee: Advanced Micro Devices, Sunnyvale, Calif.

[21] Appl. No.: 08/891,586

[22] Filed: Jul. 11, 1997

[51] Int. Cl.[6] .............................. G06F 19/00; G11C 7/00
[52] U.S. Cl. .............................. 364/468.28; 364/468.01; 364/468.02; 365/200; 365/201
[58] Field of Search ..................... 364/468.28, 468.17, 364/468.01, 468.02; 365/200, 201; 711/161, 162, 100, 120; 395/308, 309, 183.18, 182.04, 182.12, 183.19

[56] References Cited

U.S. PATENT DOCUMENTS

| | | | |
|---|---|---|---|
| 5,497,331 | 3/1996 | Iriki et al. | 364/468.28 |
| 5,598,341 | 1/1997 | Ling et al. | 364/468.17 |
| 5,611,066 | 3/1997 | Keele et al. | 711/100 |
| 5,627,963 | 5/1997 | Gabillard et al. | 395/183.18 |
| 5,631,868 | 5/1997 | Termullo, Jr. et al. | 365/200 |
| 5,633,826 | 5/1997 | Tsukada | 365/200 |
| 5,708,613 | 1/1998 | Creed et al. | 365/200 |
| 5,732,029 | 3/1998 | Lee et al. | 365/200 |
| 5,809,543 | 9/1998 | Byers et al. | 711/162 |
| 5,819,054 | 10/1998 | Ninomiya et al. | 395/308 |

Primary Examiner—William Grant
Assistant Examiner—Carolyn T. Baumgardner
Attorney, Agent, or Firm—David G. Alexander

[57] ABSTRACT

A computer is used to estimate a fabrication yield for a semiconductor product under design which includes a plurality of integrated circuit dies, each of which includes a memory cache having a predetermined redundancy scheme in the form of redundant rows and/or columns. A bitmap failure analysis of an existing semiconductor product including a plurality of integrated circuit dies having bitmap failure modes that are comparable to those of the product being designed is performed to obtain a number of failed caches. An observed repair rate is computed as a ratio of a number of the failed caches that can be repaired by the predetermined redundancy scheme to the number of failed caches. A model repair rate for the predetermined redundancy scheme which approximates the observed repair rate is computed using a multiple Poisson model including computed average numbers $\lambda$ of failures for the failure modes respectively. The numbers $\lambda$ are optimized by minimizing a least squares difference between the observed repair rates and the model repair rates. The fabrication yield is computed as a predetermined function of the model repair rate including scale factor(s) for the circuit on the wafer being designed. The method can be used to select a redundancy scheme for the wafer by computing fabrication yields for a plurality of candidate redundancy schemes, and selecting the redundancy scheme which has the highest return for additional test, manufacturing and design investment.

23 Claims, 5 Drawing Sheets

COMPUTER IMPLEMENTED METHOD FOR ESTIMATING FABRICATION YIELD FOR SEMICONDUCTOR INTEGRATED CIRCUIT INCLUDING MEMORY BLOCKS WITH REDUNDANT ROWS AND/OR COLUMNS

BACKGROUND OF THE INVENTION

1. Field of the Invention

The present invention generally relates to the art of microelectronic circuit fabrication, and more specifically to a computer implemented method for estimating a fabrication yield for a semiconductor integrated circuit including memory blocks with redundant rows and/or columns.

2. Description of the Related Art

For faster performance, modern microprocessors devote substantial area to on-chip cache memory. From microprocessor generation to generation, the trend is to include larger caches, larger both in the sense of transistor and bit count, and in fraction of mask area.

Because of their large size and symmetric form, the features defining cache are laid out more densely than in random logic, sensitizing them to smaller defects. As a result, caches have emerged as an important factor in determining overall chip yield.

Following the precedent of memory chip manufacturers, some microprocessors now include on-chip repair schemes or redundancy for their caches. A redundancy scheme includes one or more redundant rows and/or columns. If, during testing, a cache is determined to have a defect such as a failed bit or row, the defect is repaired by remapping the failed bit or row to one of the redundant rows. This can be accomplished by altering the cache itself, such as by blowing fuses, or by software in the startup routine which detects a failure and performs the remapping.

Numerous variables must be considered and traded off in the design of a new microprocessor which includes a cache memory. The goal is to produce the best possible product consistent with a high production or fabrication yield, and thereby at lowest fabrication cost. Fabrication yield is the percentage of integrated circuit dies on a wafer that are sufficiently free of defects such that they can be further processed into integrated circuit chips for sale.

Cache redundancy schemes increase yield by enabling die with certain defects to be repaired. However, redundant rows and columns take up valuable space on chips which could otherwise be used for more microprocessor logic or cache memory. For this reason, it is important to provide an estimate of the yield increase which can be provided by a given redundancy scheme, and also to determine which redundancy scheme can produce the highest return for the additional test, manufacturing and yield investment.

Methods have been proposed in the prior art for estimating the yield of a memory with a redundancy scheme. Articles entitled "Improved Yield Models for Fault-Tolerant Memory Chips", by C. Stapper, IEEE Transactions on Computers, Vol. 42, No. 7, July 1993, and "Yield Model for Productivity Optimization of VLSI Memory Chips with Redundancy and Partially Good Product", by C. Stapper et al, IBM Journal of Research and Development, Vol. 24, No. 3, May 1980 disclose methods using a multiple negative binomial model to estimate yield after repair for a particular redundancy scheme.

Newer microprocessors tend to have larger cache memories than earlier microprocessors. In addition, the architecture of the newer cache memories tends to be different from that of the earlier memories. Typically, larger cache memories will be organized into more blocks or "macros" than earlier memories.

The Stapper methods are capable of estimating the yield increase provided by a redundancy scheme for a cache memory having a given architecture based on data obtained from an existing cache memory having the same architecture. However, Stapper's methods do not include provisions for extrapolating or "scaling" yield estimates from one type of memory architecture to another.

SUMMARY OF THE INVENTION

The present invention overcomes the limitations of the prior art by providing a computer implemented method for estimating a fabrication yield for a semiconductor integrated circuit including a cache memory with redundant rows and/or columns which includes a procedure for using data obtained from one memory arrangement to estimate a yield for another memory arrangement.

In accordance with the present invention, a computer is used to estimate a fabrication yield for a semiconductor product under design which includes a plurality of integrated circuit dies, each of which includes a memory cache having a predetermined redundancy scheme in the form of redundant rows and/or columns. A bitmap failure analysis of an existing semiconductor product including a plurality of integrated circuit dies having bitmap failure modes that are comparable to those of the product under design is performed to obtain numbers of failed caches for the failure modes respectively.

An observed repair rate is computed as a ratio of a number of the failed caches that can be repaired by the predetermined redundancy scheme to a total of the number of failed caches. A model repair rate for the predetermined redundancy scheme which approximates the observed repair rate is computed using a multiple Poisson model including computed average numbers $\lambda$ of failures for the failure modes respectively.

The numbers $\lambda$ are optimized by minimizing a least squares difference between the observed repair rates and the model repair rates. The fabrication yield is computed as a predetermined function of the model repair rate including a scale factor for the circuit on the product under design. The method can be used to select a redundancy scheme for the circuit on the wafer by computing fabrication yields for a plurality of candidate redundancy schemes, and selecting the redundancy scheme which provides the highest return for additional test, manufacturing, and design investment.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
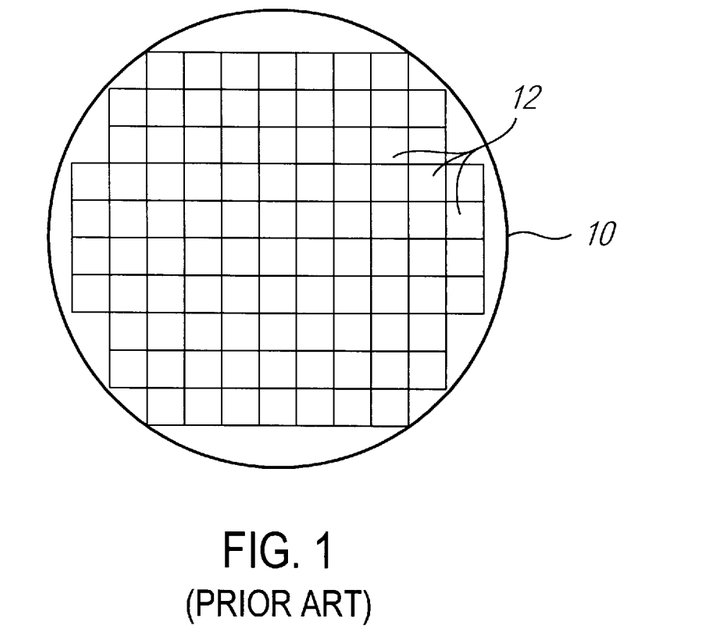
FIG. 1 is a prior art diagram illustrating a semiconductor wafer including a plurality of integrated circuit die.

FIG. 1 illustrates an exemplary semiconductor product in the form of a semiconductor wafer 10 having a plurality of integrated circuit dies 12 fabricated thereon. A goal of the fabrication process is to produce the wafer 10 such that as many of the dies 12 are sufficiently free from defects that they can be further processed into integrated circuit chips for sale.

Figure 2:
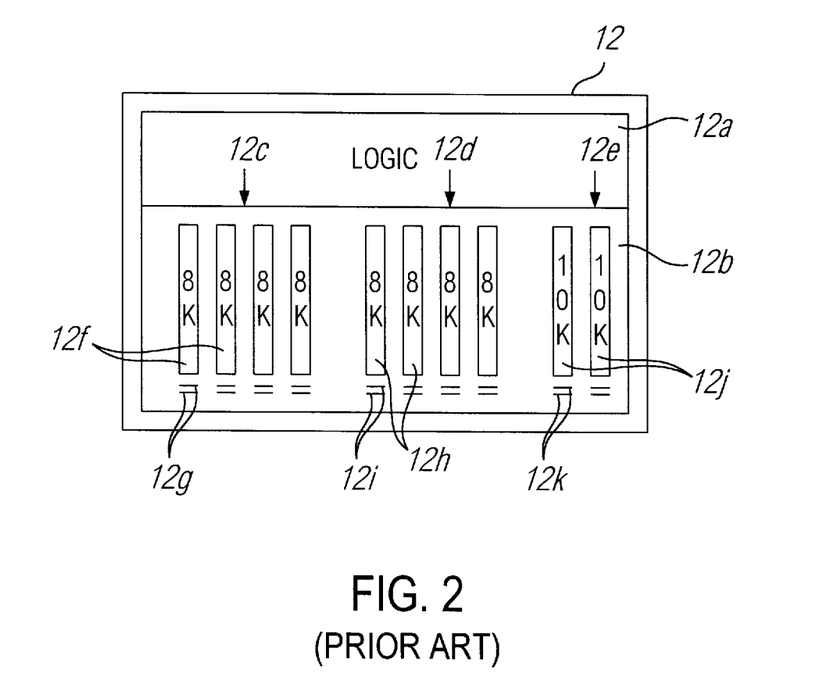
FIG. 2 is a prior art diagram of one of the dies illustrating a cache memory with redundant rows.

FIG. 2 illustrates one of the die 12 as including logic 12a and a cache memory 12b, each of which occupies a portion of the total area of the die 12. The logic 12a includes microprocessor logic as well as ROM, RAM, I/O, and associated functionality which is independent of the cache 12b.

Although the present invention will be described and illustrated as being applied to a microprocessor circuit including a cache memory, the invention is not so limited, and can be applied to any integrated circuit memory which may or may not be a cache memory, and may or may not include associated logic circuitry.

The cache memory 12b is organized in a plurality of sections or blocks. In the exemplary arrangement illustrated in FIG. 2, the memory 12b is divided into three blocks 12c, 12d and 12e. The block 12c includes four 8 kilobyte sections or macros 12f, the block 12d includes four 8 kilobyte macros, and the block 12e includes two 10 kilobyte macros 12j, for a total of 84 kilobytes of cache memory.

Figure 3:
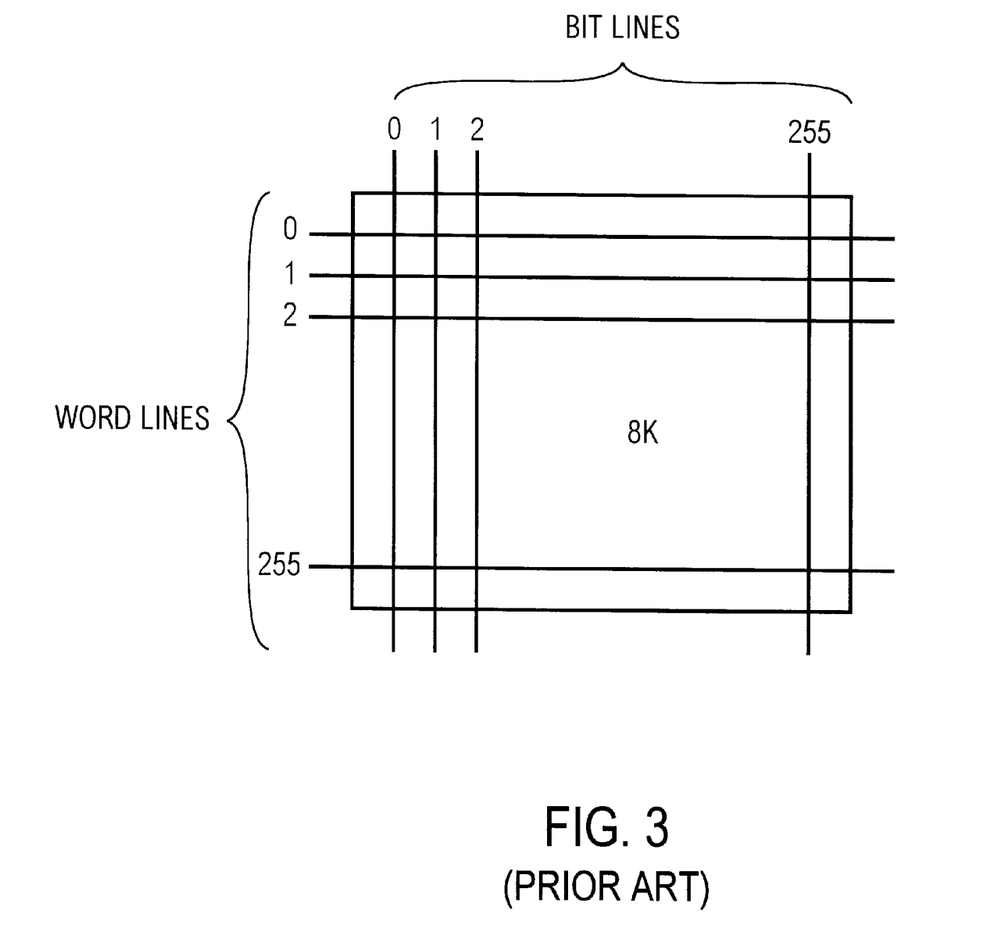
FIG. 3 is a prior art diagram illustrating an addressing architecture for one block of the cache memory.

FIG. 3 illustrates the arrangement of one of the macros, for example one of the macros 12f. The macro 12f includes 256 rows or wordlines, and 256 columns or bitlines, for a total of 65,536 bits or 8,192 bytes.

As further illustrated in FIG. 2, each macro is provided with a redundancy scheme in the form of two redundant rows of 256 bits each. The redundant rows are designated as 12g, 12i, and 12k for the macros 12f, 12h and 12j in the blocks 12c, 12d and 12e respectively, and can be used to repair certain cache defects as will be described in detail below. A particular redundancy scheme can be specified using the notation RxCy, where x is the number of redundant rows R and y is the number of redundant columns C. The redundancy scheme illustrated in FIG. 2 is denoted as R2C0.

Figure 4:
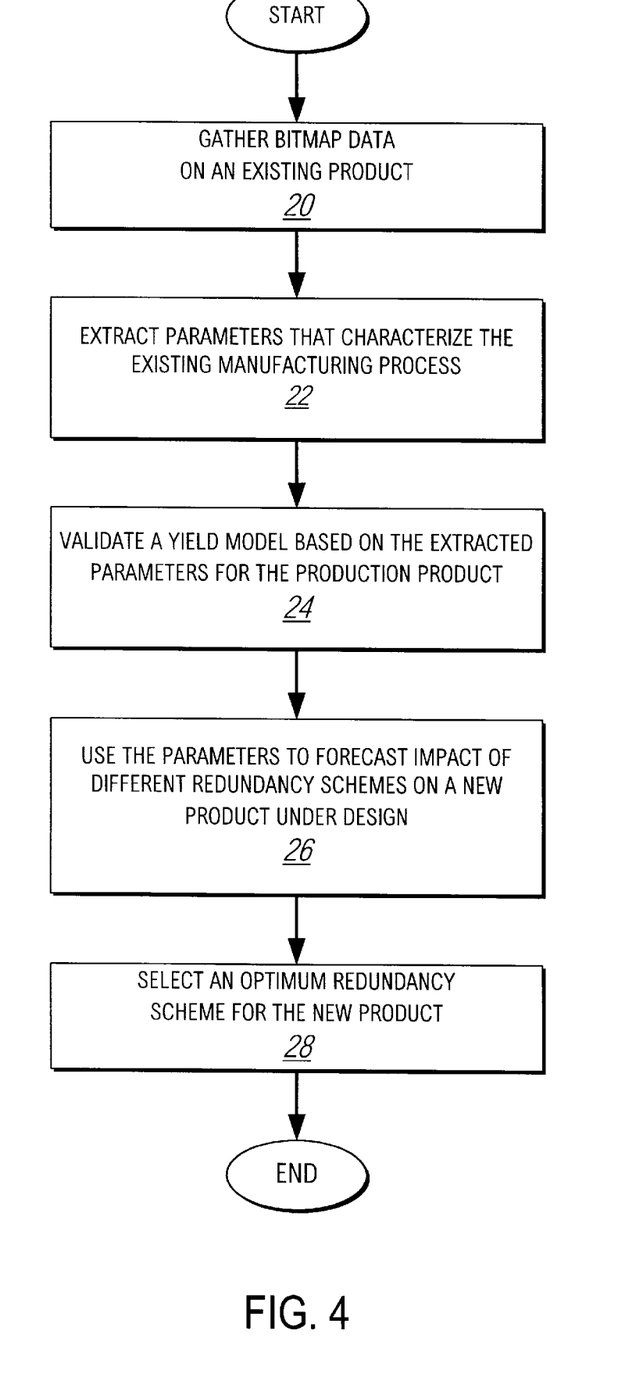
FIG. 4 is a flowchart illustrating steps for practicing a method according to the present invention.

FIG. 4 is a flowchart illustrating a method of projecting the fabrication yield for a circuit or semiconductor product on a wafer such as illustrated in FIGS. 1 to 3 in accordance with the present invention. It will be assumed that the circuit is in the design process, and that no physical samples are available for testing. It is desired to estimate the fabrication yield provided by a particular redundancy scheme in order to perform design tradeoffs as discussed above, and alternatively to estimate the yield increase that could be provided by other redundancy schemes.

The first step 20 is to gather bitmap data on an existing product, and consists of performing a bitmap failure analysis of at least one, and preferably a large number of existing wafers having failure modes that are comparable to those of the wafer 10. It is not necessary that the wafers be provided with redundancy schemes. Step 20 is performed only to obtain data relating to the numbers of failures or defects for different failure modes.

TABLE I below illustrates the results of performing bitmap failure analysis on one wafer. Bitmap testing is accomplished by storing patterns of test data in the individual memory locations of the cache, and then attempting to read out the data. A failure or defect is indicated if the data read out of a particular location does not match the data that was stored.

Table I lists eight failure modes including column and row (C/R), column (COL), row (ROW), single bit (SB), double bit vertical (DBV), double bit horizontal (DBH), cluster bit (CB) and other (OTHER). The OTHER column denotes "chip killer" failures that cannot be repaired by a redundancy scheme, and will require ejection of the entire die.

TABLE I

| X | Y | C/R | COL | ROW | SB | DBV | DBH | CB | OTHER |
|---|---|---|---|---|---|---|---|---|---|
| 2 | 15 | | | | 1 | | | | |
| 3 | 15 | | | | 2 | | | | |
| 4 | 15 | | | | 3 | | | | |
| 16 | 15 | | | | 1 | | | | |
| 4 | 16 | | | | 1 | | | | |
| 6 | 16 | | 1 | | 2 | | | | |
| 11 | 16 | | | | | | | 1 | ((CB)=4) |
| 13 | 16 | | 1 | | | | | | |
| 15 | 16 | | | | 1 | | | | |
| 5 | 17 | | | | 1 | | | | |
| 6 | 17 | | | | | 1 | | | |
| 9 | 17 | | | | 1 | | 1 | | |
| 7 | 18 | | | | 1 | | | | |
| 5 | 19 | | | | | 1 | 1 | | |
| 9 | 19 | | | | | | 1 | | |
| 5 | 20 | | | | 1 | | | | |
| 10 | 20 | | | | 1 | 1 | 1 | | |

The X and Y columns in TABLE I are the coordinates of dies on a wafer, with each die having a unique set of coordinates (values of X and Y). The numbers in the other columns are the numbers of defects for each failure mode found in the respective die.

TABLE II illustrates patterns of defects that can be repaired using a particular redundancy scheme, in this case the scheme R2C0. The patterns are numbered from 1 to 11, and the numbers of defects for each failure mode in the pattern that can be repaired are listed in the respective columns. The data is simplified by considering a C/R defect to be both a column defect and a row defect, and considering a CB defect to be an OTHER defect. This reduces the number of failure modes from 8 to 6.

TABLE II

| pattern | col | row | sb | dbv | dbh | other |
|---|---|---|---|---|---|---|
| 1 | 0 | 0 | 0 | 0 | 0 | 0 |
| 2 | 0 | 0 | 0 | 0 | 1 | 0 |
| 3 | 0 | 0 | 0 | 0 | 2 | 0 |
| 4 | 0 | 0 | 0 | 1 | 0 | 0 |
| 5 | 0 | 0 | 1 | 0 | 0 | 0 |
| 6 | 0 | 1 | 0 | 0 | 1 | 0 |
| 7 | 0 | 0 | 2 | 0 | 0 | 0 |
| 8 | 0 | 0 | 1 | 0 | 1 | 0 |
| 9 | 0 | 1 | 0 | 0 | 0 | 0 |
| 10 | 0 | 1 | 1 | 0 | 0 | 0 |
| 11 | 0 | 2 | 0 | 0 | 0 | 0 |

As illustrated in TABLE II, the two row redundancy scheme R2C0 can repair a pattern 3 defect which consists of 2 failed rows, a pattern 7 defect which consists of two failed single bits, etc. The redundancy scheme cannot repair, for example, a defect consisting of three failed rows. Also, the redundancy scheme is capable of repairing only those failure patterns listed in TABLE II.

The result of testing is a listing of the numbers of failures for all die tested by failure mode. The resulting data in combination with the repairable pattern data of TABLE II is used to calculate an observed repair rate for a particular redundancy scheme as being equal to the ratio of failed caches (dies) that can be repaired using the particular redundancy scheme to the total number of failed caches.

A next step 22 of extracting parameters that characterize the existing manufacturing process includes calculating an observed repair rate for at least as many redundancy schemes as there are failure modes. Each failure mode, as will be described in detail below, is represented by a computer generated parameter $\lambda$, which corresponds to an average number of defects of the respective failure mode per die. As described above, there are 6 failure modes and therefore 6 values of $\lambda$. In this case, values of observed repair rates will be calculated for at least 6 different redundancy schemes.

Validation of a yield model based on the extracted parameters for the production product provides and optimizes a discrete multivariate probability distribution model which enables a model repair rate to be computed for a particular redundancy scheme including values of $\lambda$ which are independent of redundancy scheme. Although a variety of such models are available, including the negative multiple binomial model used by Stapper as discussed above, the model used in accordance with the present invention is preferably a multiple Poisson model which is based on a plurality of discrete multivariate probability models.

A Poisson model for one variable is the probability Pr of occurrence of x failures of mode m, and has the form:

$$Pr = \frac{e^{-\lambda_m} \times \lambda_m^x}{x!} \quad x = 0, 1, 2, \ldots \quad (1)$$

Since there are more than one, in this case six, failure modes, the single Poisson model must be expanded to a multiple Poisson model having the form:

$$Pr\{X_1 = k_1, \ldots, X_m = k_m | \lambda_1, \ldots, \lambda_m\} = \prod_{j=1}^{m} e^{-\lambda_j} \lambda_j^{k_j} / k_j! \quad (2)$$

where m is a number of the failure modes, j is an index for the failure modes, $X_j$ is a random variable for the failure modes j, $k_j$ is a number of failures, and Pr is the probability of occurrence of $k_j$ failures of failure mode j.

The multiple Poisson model is essentially the product of the single Poisson models for the six failure modes. Equation (2) gives the probability of occurrence of $k_j$ failures for each failure mode j, and is an equation in m-dimensional space. All computations involving the multiple Poisson model must be performed using a high speed digital or other type of computer, as they are far too numerous and complex to be performed by hand.

The Model Repair Rate (MRR) is obtained from the terms in the multiple Poisson model, and has the form, for a given redundancy scheme, of:

$$MRR = \frac{\sum_{k \in RxCy-\{0\}} Pr\{X_1 = k_1, \ldots, X_i = k_i, \ldots, X_m = k_m | \lambda_1, \ldots, \lambda_m\}}{1 - Pr\{X_1 = 0, \ldots, X_i = 0, \ldots, X_m = 0 | \lambda_1, \ldots, \lambda_m\}} \quad (3)$$

where i is an index for failure modes, $k_i$ is the number of failures of failure mode i, $X_i$ is a random variable for the number of failure for modes i, and Pr is the probability of occurrence of $k_i$ failures of failure mode i over all the failure modes i.

The numerator of the model repair rate equation is the probability that a cache can be repaired using the redundancy scheme RxCy, and consists of the terms from the multiple Poisson model taken over the set of repairable patterns for that redundancy scheme. The element that is subtracted from the index set RxCy indicates that the pattern consisting of no defects is not included in the set of patterns needing repair.

The denominator of the model repair rate equation is the probability that the cache will have a defect in at least one failure mode. The term that is subtracted is the probability that the cache will not have any defects, and therefore will not need repair.

For purposes of discussion, $\lambda$ is a 6-element vector. In the general case, solution of values for $\lambda$ requires at least as many equations for modeled repair rate as the dimension of $\lambda$. For this reason, the model repair rate equation (3) is replicated at least six times on the computer, with the left side of each equation being the value of the observed repair rate for the respective redundancy scheme, and the right side of the equation being the function of the $\lambda$ parameters. The process of optimizing the values of $\lambda$ can be described as "parameter extraction".

Although including more than six equations (for six corresponding redundancy schemes) in the parameter extraction process would be technically redundant, the optimization accuracy increases with the number of number of equations, but using a smaller number of equations ensures a better fit of observed repair rates for the redundancy schemes in the range of interest.

The six (or preferably more) equations are solved simultaneously using the computer by iteratively or otherwise varying the individual $\lambda$ parameters until the computed values of model repair rate most closely approximate the observed repair rate values.

Various methods can be used to optimize the values of $\lambda$. The preferred method in accordance with the present invention is to minimize the least squares difference between the observed repair rates and the model repair rates. However, the invention is not so limited, and other methods, such as conventional Maximum Likelihood Estimation (MLE) can be used.

Once the model repair rate equation has been defined by extracting or optimizing the parameters $\lambda$, it can be used, in a step 24, to compute a model repair rate for a particular redundancy scheme which uses the parameters to forecast the impact of different redundancy schemes on a new product under design. This is performed by solving the model repair rate equation using the optimized values of $\lambda$ (which are independent of redundancy scheme) over the set of repairable patterns for the a particular redundancy scheme RxCy as described above.

Solution of the model repair rate equation (3) produces a model repair rate value R for each redundancy scheme. The fabrication yield is computed for a given redundancy scheme and a similar cache architecture in a step 28 which includes selecting an optimum redundancy scheme for the new product using a function having the form:

$$Y' = Y + Y^{(1-\alpha)} \times (1-Y^\alpha) \times R \quad (4)$$

where Y' is the fabrication yield after repair, Y is a yield without requiring repair by the redundancy scheme, $\alpha$ is the ratio of the cache area 12b to the total die area including the logic 12a, and R is the model repair rate. The value of Y is obtained empirically from conventional unrepaired yield data from past fabrication runs on existing wafers.

Equation (4) includes several terms which represent corresponding contributions to the yield Y'. The term $Y^{(1-\alpha)}$ is the yield of the non-cache area (logic 12a in FIG. 2), or the probability that the non-cache area will not fail. (One can consider the general case where $y^{(1-\alpha)}$ is replaced by $y^\beta$. When $\beta+\alpha=1$, as is presented here, scaling is in proportion to area alone; when $\beta+\alpha=1$, a circuit with twice the area of one with yield Y is assumed to yield $y^2$). The term $(1-Y^\alpha)$ is the non-yield of the cache area (cache 12b in FIG. 2) without repair, or the probability that the cache area will have a defect in at least one failure mode (need repair). The term R is the model repair rate: That is, conditional on the events (a) that the cache area will not need repair, and (b) that the cache will need repair, R is the probability that the cache is repairable using the redundancy scheme under consideration.

Figure 5:
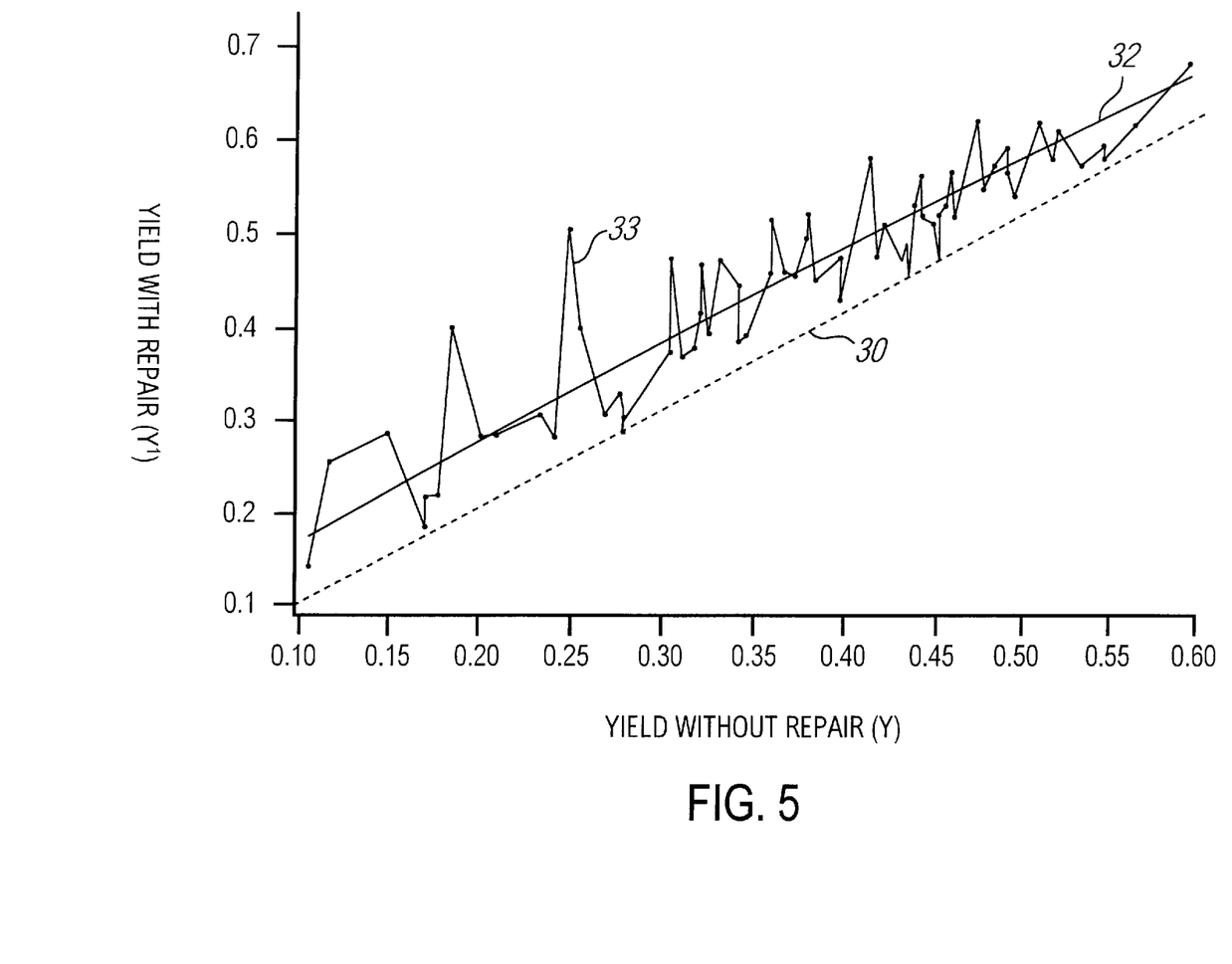
FIG. 5 is a graph illustrating yield after repair as a function of yield without repair.

The results of applying the yield equation (4) with Y as an independent variable is illustrated in FIG. 5, in which a line illustrates the case of no cache repair (Y'=Y), and a curve 32 illustrates the repaired yield Y' compared to actual data 33 for an exemplary redundancy scheme.

The value α is a scale factor which enables a yield calculation to be made for arrangements in which the ratios of the cache area to the total die area are different. The value α is nominally equal to the ratio of the cache area to the total die area, but can optionally be adjusted to more closely correlate the results of equation (4) with empirically obtained data.

The value of α can also be determined empirically. This can be accomplished by solving equation (4) for α using empirically determined values of Y, Y' and R for an existing product. In this case, α can be considered as a "sensitivity factor" related to the product.

In a step 26, "geometric scaling" can be used to compensate for caches having different numbers of rows. For example, if the bitmap data was obtained for a cache having 256 rows, and the yield is to be computed for a cache having 512 rows, the values of each λ that relate to a row failure mode (single bit failure, double horizontal bit failure, etc.) will be multiplied by the row ratio, in this case 512/256=2.

The repair rate can also be scaled to accommodate different cache architectures. In this case, a separate scale factor is used for each subset of sections or blocks. The yield equation in such a case has the form:

$$Y' = Y^{(1-\Sigma \alpha_i)} \prod_{i=1}^{n} \{Y^{\alpha_i} + R_i \cdot (1 - Y^{\alpha_i})\} \quad (5)$$

where Y' is the fabrication yield, Y is the yield without requiring repair by the redundancy scheme, n is the number of sections, i is an index for the sections, $\alpha_i$ in this case is the ratio of the area of the section i to the total die area, and $R_i$ is the model repair rate for the section i. A variation of the method is to take α as the ratio of the area of the section i to the total cache area, multiplied by a sensitivity factor.

Step 28 includes selection of an optimal redundancy scheme for a particular cache being designed. This is accomplished by calculating the yield after repair as described above for all candidate redundancy schemes, i.e. as illustrated in FIG. 6, and selecting the scheme which has the best value of yield.

Figure 6:
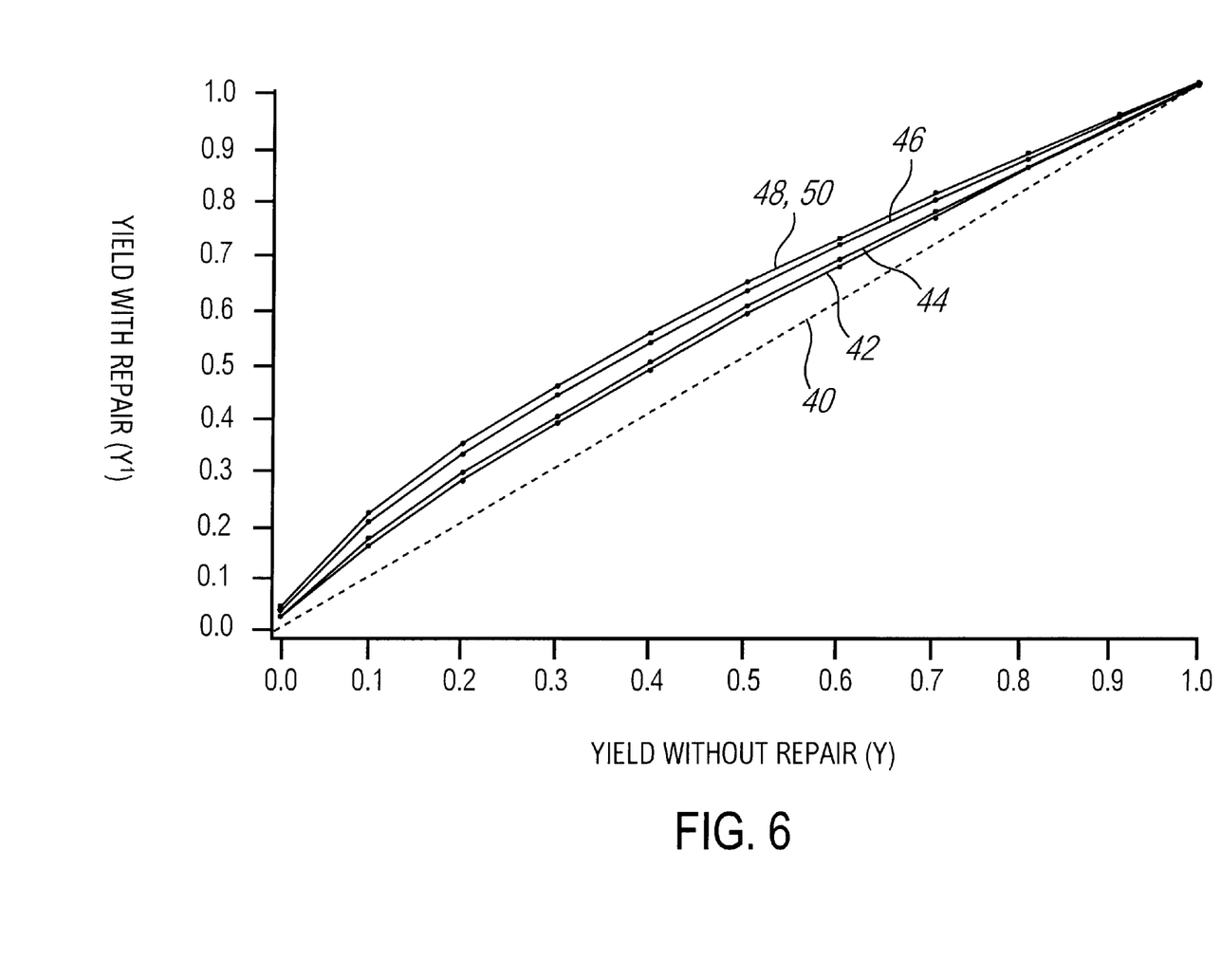
FIG. 6 is a graph illustrating theoretical yield after repair as a function of yield without repair for various redundancy schemes.

In the example of FIG. 6, a line 40 illustrates the case of no cache repair (Y'=Y). The other curves represent redundancy schemes as follows.

42—1 row
44—1 column
46—2 rows
48—2 columns
50—1 row and 1 column

The curves 48 and 50 substantially coincide.

In general, adding more redundancy improves the yield, but increases the overall cost of the product. Therefore, a tradeoff is made involving yield as well as additional test, manufacturing and design investment, and any other relevant factors. A cost factor is defined as a predetermined function of the yield as illustrated in FIG. 6 and the other variables, such that the lowest cost factor provides the highest ratio of yield to production cost. The cost factor is calculated for each redundancy scheme, and the redundancy scheme which has the lowest cost factor is selected for the product.

In summary, the present invention overcomes the limitations of the prior art by providing a computer implemented method for estimating a fabrication yield for a semiconductor integrated circuit including a cache memory with redundant rows and/or columns which includes a procedure for using data obtained from one memory arrangement to estimate a yield for another memory arrangement.

Various modifications will become possible for those skilled in the art after receiving the teachings of the present disclosure without departing from the scope thereof. For example, although the multiple Poisson model has been described in detail above as being preferred for practicing the present invention, other models such as the multiple negative binomial model described by Stapper can alternatively be used.

Also, it has been assumed that the model repair rate values for the various redundancy schemes are independent of the value of overall yield, or yield without cache repair, and also that the failure modes are independent of each other. In some applications these assumptions may not be valid, and the scope of the invention includes modification to accommodate these and other variations.

We claim:

1. A computer implemented method for estimating a fabrication yield for a semiconductor product under design including a plurality of design integrated circuit dies, each of which includes a memory cache having a predetermined redundancy scheme, comprising the steps of:

(a) performing a bitmap failure analysis of an existing semiconductor product including a plurality of existing integrated circuit dies having bitmap failure modes that are comparable to those of the design dies to obtain a number of failed caches;

(b) calculating an observed repair rate as a ratio of a number of said failed caches that can be repaired by the predetermined redundancy scheme to a total of said number of failed caches;

(c) computing, using a computer, a model repair rate for the predetermined redundancy scheme which approximates the observed repair rate using a discrete multivariate probability distribution model including computed average numbers λ of failures for the failure modes respectively; and (d) calculating the fabrication yield as a predetermined function of the model repair rate including a scale factor for the semiconductor product under design.

2. A method as in claim 1, in which the model is based on a plurality of discrete probability models.

3. A method as in claim 1, in which step (c) comprises optimizing the model using a minimum least squares difference between the observed repair rate and the model repair rate.

4. A method as in claim 1, further comprising using a computer to perform the steps, prior to step (c), of:

(e) using the model to calculate model repair rates as ratios of numbers of said failed caches that can be repaired by a plurality of redundancy schemes to a total of said number of failed caches for at least as many redundancy schemes as failure modes respectively; and (f) optimizing the numbers $\lambda$ such that the model repair rates most closely approximate the observed repair rates respectively.

5. A method as in claim 4, in which step (f) comprises minimizing a least squares difference between the observed repair rates and the model repair rates.

6. A method as in claim 4, in which the model is based on a plurality of discrete multivariate probability models.

7. A method as in claim 6, in which the plurality of discrete multivariate probability models are represented by a multiple Poisson model having the form:

$$Pr\{X_1 = k_1, \ldots, X_m = k_m | \lambda_1, \ldots, \lambda_m\} = \prod_{j=1}^{m} e^{-\lambda_j} \lambda_j^{k_j} / k_j!$$

where m is a number of the failure modes, j is an index for the failure modes, $X_j$ is a random variable for the failure modes j, $k_j$ is a number of failures, and Pr is the probability of occurrence of $k_j$ failures of failure mode j.

8. A method as in claim 4, in which the model repair rate for a redundancy scheme RxCy has the form:

$$MRR = \frac{\sum_{k \in RxCy-\{0\}} Pr\{X_1 = k_1, \ldots, X_i = k_i, \ldots, X_m = k_m | \lambda_1, \ldots, \lambda_m\}}{1 - Pr\{X_1 = 0, \ldots, X_i = 0, \ldots, X_m = 0 | \lambda_1, \ldots, \lambda_m\}}$$

where i is an index for failure modes, $k_i$ is the number of failures of failure mode i, $X_i$ is a random variable for the number of failure for modes i, and Pr is the probability of occurrence of $k_i$ failures of failure mode i over all the failure modes i.

9. A method as in claim 1, in which the scale factor includes a ratio of a cache area to a die area.

10. A method as in claim 9, in which the predetermined function has the form:

$$Y' = Y + Y^{(1-\alpha)} \times (1 - Y^{\alpha}) \times R$$

where Y' is the fabrication yield, Y is a yield without requiring repair by the redundancy scheme, $\alpha$ is the ratio of the cache area to the die area, and R is the model repair rate.

11. A method as in claim 9, in which the predetermined function has the form:

$$Y' = Y + Y^{(1-\alpha)} \times (1 - Y^{\alpha}) \times R$$

where Y' is the fabrication yield, Y is a yield without requiring repair by the redundancy scheme, $\alpha$ is the ratio of the cache area to the die area multiplied by a sensitivity factor, and R is the model repair rate.

12. A method as in claim 1, in which the predetermined function has the form:

$$Y' = Y + Y^{(1-\alpha)} \times (1 - Y^{\alpha}) \times R$$

where Y' is the fabrication yield, Y is a yield without requiring repair by the redundancy scheme, $\alpha$ is sensitivity factor which is calculated by solving the predetermined function for $\alpha$ using empirically determined values of Y, Y' and R for an existing semiconductor product, and R is the model repair rate.

13. A method as in claim 1, in which:

the cache comprises a plurality of sections; and the predetermined function comprises a scale factor for each section respectively.

14. A method as in claim 13, in which the predetermined function has the form:

$$Y' = Y^{(1-\alpha)} \prod_{i=1}^{n} \{Y^{\alpha} + R_i \times (1 - Y^{\alpha})\}$$

where Y' is the fabrication yield, Y is a yield without requiring repair by the redundancy scheme, n is a number of the sections, i is an index for the sections, $\alpha_i$ is the ratio of an area of the section i to the cache area and constitutes said scale factor, and $R_i$ is the model repair rate for the section i.

15. A method as in claim 1, in which the scale factor is a predetermined function of a number of rows and/or columns in the cache of each design die and a number of rows in the cache of each existing die.

16. A method as in claim 15, in which the scale factor is substantially equal to the number of rows and/or columns in the cache of each design die to the number of rows in the cache of each existing die.

17. A method as in claim 1, in which:

each design die further includes a logic section; and the scale factor is a predetermined function of an area of the cache and an area of the logic section.

18. A method as in claim 17, in which the scale factor is substantially equal to a ratio of the area of the cache to the sum of the areas of the cache and the logic section.

19. A method as in claim 1, further comprising the steps of:

(e) repeating steps (b) to (d) for a plurality of predetermined redundancy schemes from which said predetermined redundancy scheme can be selected; and (f) selecting said predetermined redundancy scheme as the one of said plurality of predetermined redundancy schemes for which a cost factor is lowest.

20. A computer implemented method for creating a fabrication yield model for a semiconductor product under design including a plurality of design integrated circuit dies, each of which includes a memory cache having a predetermined redundancy scheme, comprising the steps of:

(a) performing a bitmap failure analysis of an existing semiconductor product including a plurality of existing integrated circuit dies having bitmap failure modes that are comparable to those of the design dies to obtain a number of failed caches;

(b) calculating an observed repair rate as a ratio of a number of said failed caches that can be repaired by the predetermined redundancy scheme to a total of said number of failed caches;

(c) creating a multivariate probability distribution model on a computer including average numbers $\lambda$ of failures for the failure modes respectively;

(d) calculating, using the model on the computer, model repair rates as ratios of numbers of said failed caches that can be repaired by a plurality of redundancy schemes to a total of said number of failed caches for at least as many redundancy schemes as failure modes respectively; and (d) optimizing the numbers λ using a computer such that the model repair rates most closely approximate the observed repair rates respectively by minimizing a least squares difference between the observed repair rates and the model repair rates.

21. A method as in claim 20, in which the model is based on a multiple Poisson model.

22. A method as in claim 20, in which the multiple Poisson model has the form:

$$Pr\{X_1 = k_1, \ldots, X_m = k_m \mid \lambda_1, \ldots, \lambda_m\} = \prod_{j=1}^{m} e^{-\lambda_j} \lambda_j^{k_j} / k_j!$$

where m is a number of the failure modes, j is an index for the failure modes, $X_j$ is a random variable for the failure modes j, $k_j$ is a number of failures, and Pr is the probability of ccurrence of $k_j$ failures of failure mode j.

23. A method as in claim 20, in which the model repair rate for a redundancy scheme RxCy has the form:

$$MRR = \frac{\sum_{k \in RxCy-\{0\}} Pr\{X_1 = k_1, \ldots, X_i = k_i, \ldots, X_m = k_m \mid \lambda_1, \ldots, \lambda_m\}}{1 - Pr\{X_1 = 0, \ldots, X_i = 0, \ldots, X_m = 0 \mid \lambda_1, \ldots, \lambda_m\}}$$

where i is an index for failure modes, $k_i$ is the number of failures of failure mode i, $X_i$ is a random variable for the number of failure for modes i, and Pr is the probability of occurrence of $k_i$ failures of failure mode i over all the failure modes i.

* * * * *